United States Patent [19]
Bergk et al.

[11] Patent Number: 5,973,497
[45] Date of Patent: Oct. 26, 1999

[54] METHOD OF DETERMINING AND DISPLAYING BATTERY CHARGE STATUS

[75] Inventors: Günther Bergk, Niedernhausen; Jochen Cimbal, Friedberg, both of Germany

[73] Assignee: Braun Aktiengesellschaft, Frankfurt am Main, Germany

[21] Appl. No.: 08/833,938

[22] Filed: Apr. 14, 1997

Related U.S. Application Data

[63] Continuation of application No. PCT/EP95/03736, Sep. 22, 1995, abandoned.

[30] Foreign Application Priority Data

Oct. 21, 1994 [DE] Germany ............... 44 37 647

[51] Int. Cl.$^6$ ............... G01R 31/36; G01N 27/416
[52] U.S. Cl. ............... 324/428; 324/427; 324/433; 340/636
[58] Field of Search ............... 324/426, 427, 324/428, 433, 435; 340/636

[56] References Cited

U.S. PATENT DOCUMENTS

| | | | |
|---|---|---|---|
| 4,193,026 | 3/1980 | Finger et al. | 324/428 |
| 4,536,757 | 8/1985 | Ijntema | 340/636 |
| 4,876,513 | 10/1989 | Brilmyer et al. | 324/427 |
| 4,931,737 | 6/1990 | Hishiki | 324/431 |
| 5,648,717 | 7/1997 | Uskali | 324/428 |

FOREIGN PATENT DOCUMENTS

| | | |
|---|---|---|
| 0 359 237 | 3/1990 | European Pat. Off. . |
| 0 425 044 | 5/1991 | European Pat. Off. . |
| 0 487 784 | 6/1992 | European Pat. Off. . |
| 0 600 234 | 6/1994 | European Pat. Off. . |
| 33 21 045 | 12/1983 | Germany . |
| 41 31 417 | 4/1993 | Germany . |
| 41 31 981 | 4/1993 | Germany . |

*Primary Examiner*—Glenn W. Brown
*Attorney, Agent, or Firm*—Fish & Richardson P.C.

[57] ABSTRACT

A method of determining and displaying the charge status of a storage battery of a battery-operated appliance, such as a razor. A time-based charge status is calculated, based at least in part on the cumulative operating time of the appliance since recharging. The battery terminal voltage is also monitored. The time-based charge status is displayed until the battery voltage indicates a low voltage condition, at which point a low-charge alert indicator is displayed only if the time-based charge status is below a predetermined level (i.e., if the cumulative operating time is above a predetermined level). Methods of detecting battery aging, and for accounting for periods of excessive current flow, are included.

14 Claims, 6 Drawing Sheets

MOTOR SPEED v. PULSE DUTY FACTOR AT POINT (B)

METHOD OF DETERMINING AND DISPLAYING BATTERY CHARGE STATUS

CONTINUING DATA

This is a continuation of PCT/EP95/03736, filed Sep. 22, 1995, now abandoned.

BACKGROUND OF THE INVENTION

This invention relates to a method of determining the charge status of a storage battery, and to a method of determining the aging of a storage battery.

More accurate determinations are needed of when the low-charge status of a storage battery is actually reached. This low-charge status equates to a terminal voltage corresponding to a residual capacity of, for example, 10 to 20 percent of the rated capacity of the battery. With this residual charge it is still possible to operate the power-consuming device reliably. The battery voltage drops as its capacity (i.e., its charge) drops.

If the power-consuming device places a higher than normal load on the storage battery (i.e., if a greater amount of current flows through the storage battery), the storage battery's terminal voltage will drop at an accordingly higher rate that with a current of normal magnitude. Inside the storage battery itself a voltage drop occurs that is equal to the product of the internal resistance of the storage battery and the current. From this it results that a drop in the storage battery's terminal voltage equivalent to a drop in capacity of the storage battery can also be observed when the current increases. If, therefore, the terminal voltage is used as the sole criterion for determining the storage battery's capacity, an accordingly far advanced discharge status of the storage battery will be assumed to exist when lowering of the voltage is caused by a comparatively large current through the power-consuming device, even though its capacity is comparatively well above the low-charge point. In this case the storage battery still has a comparatively large capacity.

A prior art method for determining and displaying charge status is disclosed in DE-OS 41 31 981 A1 (U.S. Pat. No. 5,623,193), which describes how the operating time of an electrical appliance, particularly a shaving apparatus, is monitored with a counter. This prior art method features the activation of segments of a display in accordance with the operating time, indicating to the user the current charge status of the storage battery or batteries. If a voltage discriminator detects that the measured terminal voltage of the storage batteries has reached a predetermined lower threshold value, then the readout of the display is set to a condition indicative of a charge status that corresponds to the lower threshold value and a counter presetting a specified residual operating time of the electrical appliance is started. After this residual operating time has elapsed, the electrical appliance is switched off by appropriate activation of an electronic switching device. This switching off can be effected by instant switch-off or by a slow reduction of power, thus resulting in the case of a shaving apparatus in a slow reduction of speed.

SUMMARY OF THE INVENTION

It is an object of the present invention to improve the determination and display of the charge status of storage batteries in battery-operated appliances.

According to one aspect of the invention, a method is provided for determining and displaying charge status of a storage battery connected to a power-consuming device through which the storage battery is discharged to a predetermined residual charge. The method includes the steps of calculating a time-based charge status corresponding to cumulative operating time of the power-consuming device, comparing terminal voltage of the storage battery to a predetermined lower voltage threshold value, and displaying a predetermined low charge alert indicator on a display only when both the time-based charge status is at or below a predetermined lower limit and the terminal voltage is below the lower voltage threshold value.

In some instances, the method includes comparing the frequency at which the lower threshold value is lowered to a predetermined frequency, and, when the frequency at which the lower threshold value is lowered exceeds the predetermined frequency, displaying a message signaling that the power-consuming device requires service. This can alert the operator when an adaptation of the variation of the characteristic curve is no longer suitable to reliably maintain the function of the appliance, and that the storage battery has to be replaced.

In some embodiments, the method also includes lowering the predetermined lower voltage threshold value by a specified amount when the terminal voltage falls below the lower voltage threshold value before the time-based charge status reaches its predetermined lower limit. In this manner, the method can advantageously adapt the detection of the low-charge point to the variation of the characteristic curve of the storage battery's terminal voltage with advancing discharge as a function of time.

In some embodiments the method also includes comparing the frequency at which the lower threshold value is lowered to a predetermined frequency, and, when the frequency at which the lower threshold value is lowered exceeds the predetermined frequency, setting, in the power-consuming device, a fault code readable during servicing. Thus, the servicing operation can be simplified because the corresponding fault condition is then quickly identified in the course of servicing, without having to subject the appliance to a complete function test.

Some embodiments include the steps of, once the low charge alert indicator is displayed, waiting a preset length of time, and then displaying a "zero" charge status and disconnecting the power-consuming device from the storage battery unit by means of a controllable switching device. By automatically disconnecting the power-consuming device from the storage battery, the function of the appliance is suspended demonstrably to the user on account of the draining of the storage battery at a defined moment, and the storage battery is subjected to less strain when it is not deep discharged to complete exhaustion. This residual charge of the storage battery enables components such as microprocessors or ASICs, which require a minimum voltage to perform certain basic functions, to run for some further time. This time can amount to a magnitude of several weeks.

Preferably, the power-consuming device is switched off by decreasing power consumption of the power-consuming device to zero over an extended period of time. This is advantageous with an electric shaver or hair cutter, for example, because the risk of hairs being caught by a sudden switching off of the appliance can be eliminated. The reduction of speed can extend over several seconds.

In some preferred embodiments, the decrease in power consumption of the power-consuming device generally follows near-discharge voltage discharge characteristics of the storage battery. This can enable the user to identify the noise of the appliance's suspension of function when the storage battery is discharged and to identify (even without observing the display at that particular moment) why the function of the appliance has been suspended.

In some cases the method includes, once the low charge alert indicator is displayed, indicating on the display a time remaining until the preset length of time has elapsed. This can provide a simplified means of indicating to the user the residual running time of the appliance as accurately as possible when the storage battery is nearing the end of its discharge.

In some embodiments, the low charge alert indicator is displayed only when both the time-based charge status is at or below a predetermined lower limit and the terminal voltage is below the lower voltage threshold value, and when electrical current flowing from the storage battery is determined to be below a predetermined current limit, such as a current limit corresponding to an expected maximum current flow under normal operating conditions.

According to another aspect of the invention, a method of determining and displaying charge status of a storage battery connected to a power-consuming device includes the steps of:

(1) calculating a time-based charge status based at least in part on cumulative operating time of the power-consuming device since a latest recharge;

(2) comparing terminal voltage of the storage battery to a predetermined lower voltage threshold value;

(3) displaying via a charge status indicator the calculated time-based charge status until the time-based charge status is at or below a predetermined lower limit and the terminal voltage is below the lower voltage threshold value; and, (4) only when both the time-based charge status is at or below a predetermined lower limit and the terminal voltage is below the lower voltage threshold value, displaying a low-charge status indicator.

According to another aspect of the invention, a method of determining and displaying charge status of a storage battery connected to a power-consuming device includes the steps of monitoring cumulative operating time of the power-consuming device since a latest recharge; monitoring terminal voltage of the storage battery; and, only when cumulative operating time is above a predetermined upper limit and terminal voltage is below a predetermined lower limit, displaying a low-charge status indicator.

According to another aspect of the invention, an improved battery-operated appliance is provided, employing the methods disclosed herein for determining and displaying the charge status of a battery of the appliance. In some embodiments, the appliance comprises an electric shaver or hair cutter.

The invention features the advantageously combined evaluation of charge status as determined from terminal voltage (voltage-based charge status) and the charge status established from the operating time of the power-consuming device (time-based charge status), resulting in an improved indication of the storage battery's low charge status.

If, with a calculated time-based charge status above its predetermined lower limit, the storage battery's terminal voltage drops below the predetermined lower threshold value, this is taken to mean that the storage battery is being loaded momentarily with a higher current, and that the storage battery's charge status has not yet reached the corresponding low-charge point. The falling of the terminal voltage to a value below the predetermined lower threshold value is ignored, therefore, in this case. The charge status indicated on the display thus continues to be the charge status as determined on the basis of the cumulative operating time of the storage battery.

If, on the other hand, the storage battery's terminal voltage falls below its predetermined lower threshold value when the determined time-based charge status has already reached a predetermined lower limit, it is possible to conclude with relative certainty that this drop in terminal voltage is attributable to a drop in capacity of the storage battery. In this case the readout on the display is reset to indicate a charge status of the storage battery in accordance with the lower voltage threshold value.

In some cases it is advantageously possible to conclude, by evaluating the current, whether the drop in the storage battery's terminal voltage is directly attributable to a drop in the storage battery's capacity, or whether the drop in terminal voltage is owed to a higher current. In the former case it is deduced that the storage battery's charge status has reached the value corresponding to the detected low terminal voltage, and the readout of the display is reset to indicate this low voltage-based charge status. In the latter case the time-based charge status will continue to be indicated on the display.

However, one advantage of some embodiments of the invention is that it can provide improved determination of charge status without measuring and evaluating current.

The invention can also provide a means for detecting battery aging. This may be accomplished by recording the actual effect of the internal resistance of the storage battery through evaluation of the current, thereby enabling the actual reaching of the low-charge point to be reliably detected by the simultaneous recording of the terminal voltage. Aging of the storage battery exists when this actual low-charge point is reached while the time-based charge status indicates a more or less large residual capacity. It is considered that the corresponding charge status at the recorded low-charge point deviates from the time-based charge status and that this deviation only occurs after a period of time when this is to be expected as the result of normal aging of the storage battery. It is considered that this deviation occurs with a certain frequency and regularity. It is also considered whether there is any reason for a high load current that could explaining the deviation.

An embodiment of the invention is presented in greater detail in the accompanying drawings. From the context it will be understood that the term "storage battery" means a storage battery unit which may be comprised of one or more cells.

BRIEF DESCRIPTION OF DRAWINGS

FIG. 1 is a first-level block diagram of the device;

FIG. 2 is a second-level block diagram of the device of FIG. 1, with a motor as the electrical load;

FIG. 3 is a graph showing an output signal of the pulse duration modulator when the speed of the motor is reduced in accordance with a decreasing battery voltage; and FIG. 4 is a graph showing the speed of the motor as a function of the pulse duty factor of the pulse duration modulator.

FIGS. 5 and 6 illustrate alternate methods of checking whether the low-charge point of the storage battery is actually reached at the instant of time when the storage battery's terminal voltage falls below the predetermined lower threshold value; and FIG. 7 is a detailed flow chart of one block of each of FIGS. 5 and 6.

DETAILED DESCRIPTION OF EMBODIMENTS

Figure 1:
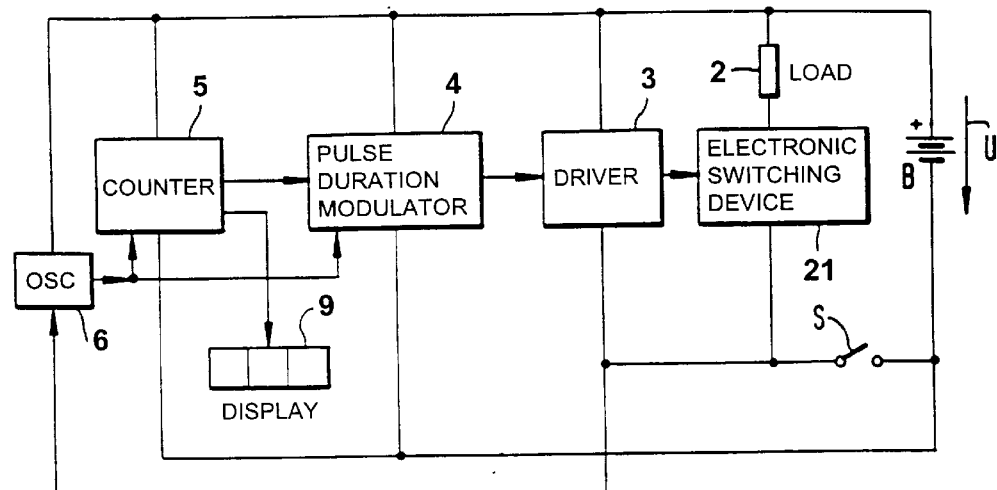
FIGS. 1–4 functionally illustrate the control of a battery-operated device, as known in the art. Of these.

Referring first to FIG. 1 of the drawings, a load 2 is concerned to a battery (accumulator) B by means of an On/Off switch S and an electronic switching device 21. The battery B can be recharged by means of a charging circuits not shown. The electronic switching device 21 is driven by a pulse-duration modulator 4 via a driver circuit 3.

A counter 5 records the time period during which the load L, which has an essentially constant power consumption, is connected to the battery B via the switch S, the count starting from a fully charged condition of the battery.

The rated capacity of the battery B being also known, a display 9 indicating the charge status of the battery is controlled by the counter 5 on a time basis. After a predetermined connection time has elapsed which is determined on the basis of the known power consumption and the known rated capacity of the battery B, such that the battery then contains only a low residual charge, counter 5 will deliver an output signal. At this point, a charge indicator on display 9 will indicate the charge status "zero." This signal will cause the electronic switching device 21 to be driven. Driving may be accomplished by a pulse-duration modulator 4 which gradually reduces the pulse duty factor for the control voltage down to zero, thus also gradually reducing the current flowing through the load 2. An oscillator 6 provides the clock pulses for the counter 5 and the pulse-duration modulator 4.

Figure 2:
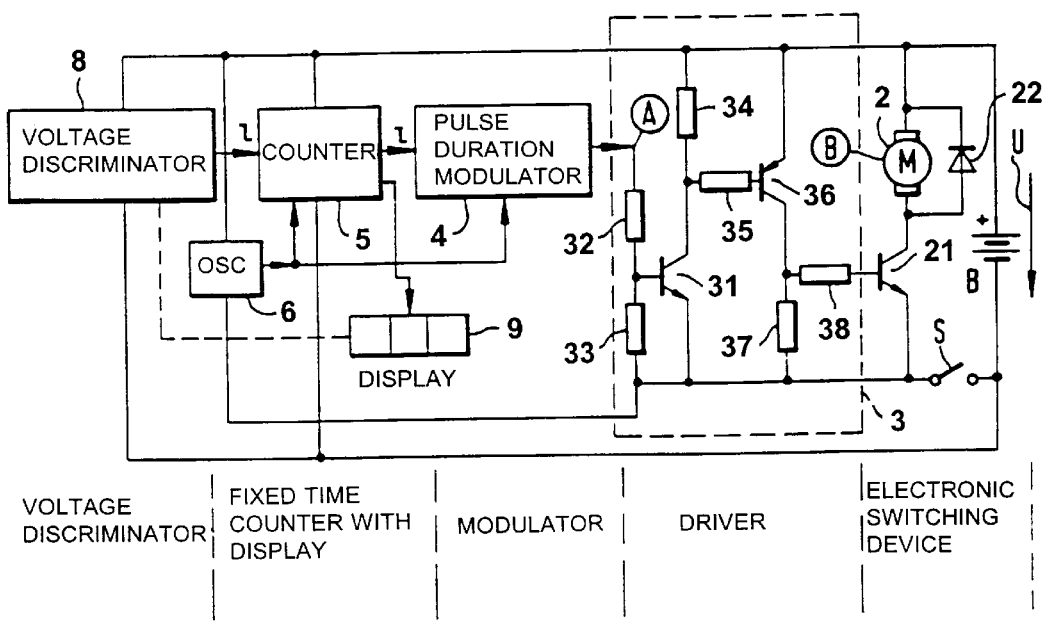

Referring to FIG. 2, load 2 is a direct current motor M of an electric shaving apparatus, for example. The series arrangement comprising the motor M and the switching transistor 21 is applied to the battery B via the On/Off switch S when the device is set in operation. A diode 22 connected in parallel with the motor M prevents inductive voltage peaks. The base of the switching transistor 21 is driven by the output of the pulse-duration modulator 4 via a driver circuit 3 comprised of transistors 31, 36 and resistors 32, 33, 34, 35, 37, 38.

Connected directly in parallel with the battery B (i.e., bypassing the On/Off switch S) are a voltage discriminator 8 and counter 5. The voltage discriminator 8 determines when the battery terminal voltage reaches a predetermined terminal voltage U corresponding to a residual battery capacity of 10 to 20 percent of its rated (full) capacity. This predetermined terminal voltage threshold is called the "low charge" voltage level. Until this low charge level is reached, the display 9 will indicate the charge status calculated on the basis of the preceding time period during which the motor M has been connected to the battery B (the "time-based" charge status).

In the prior art method, as soon as the voltage discriminator 8 has detected the low charge level of the voltage U across battery B, counter 5 and a second indicator on display 9 are started. When the detected low-charge level is attained, the motor has, for example, only eight minutes of operation left until battery B is completely depleted. The time period predetermined for counter 5 is then six minutes, for example, in order to preclude complete discharging of the battery. This period of six minutes may be subdivided into six fixed time intervals of equal length so that each minute one segment of the second indicator of display 9 is driven. These segments may also indicate the minutes remaining until expiration of the predetermined time period. After the predetermined time (six minutes) has elapsed (i.e., when counter 5 has reached zero), pulse-duration modulator 4 will be driven.

Figure 3:
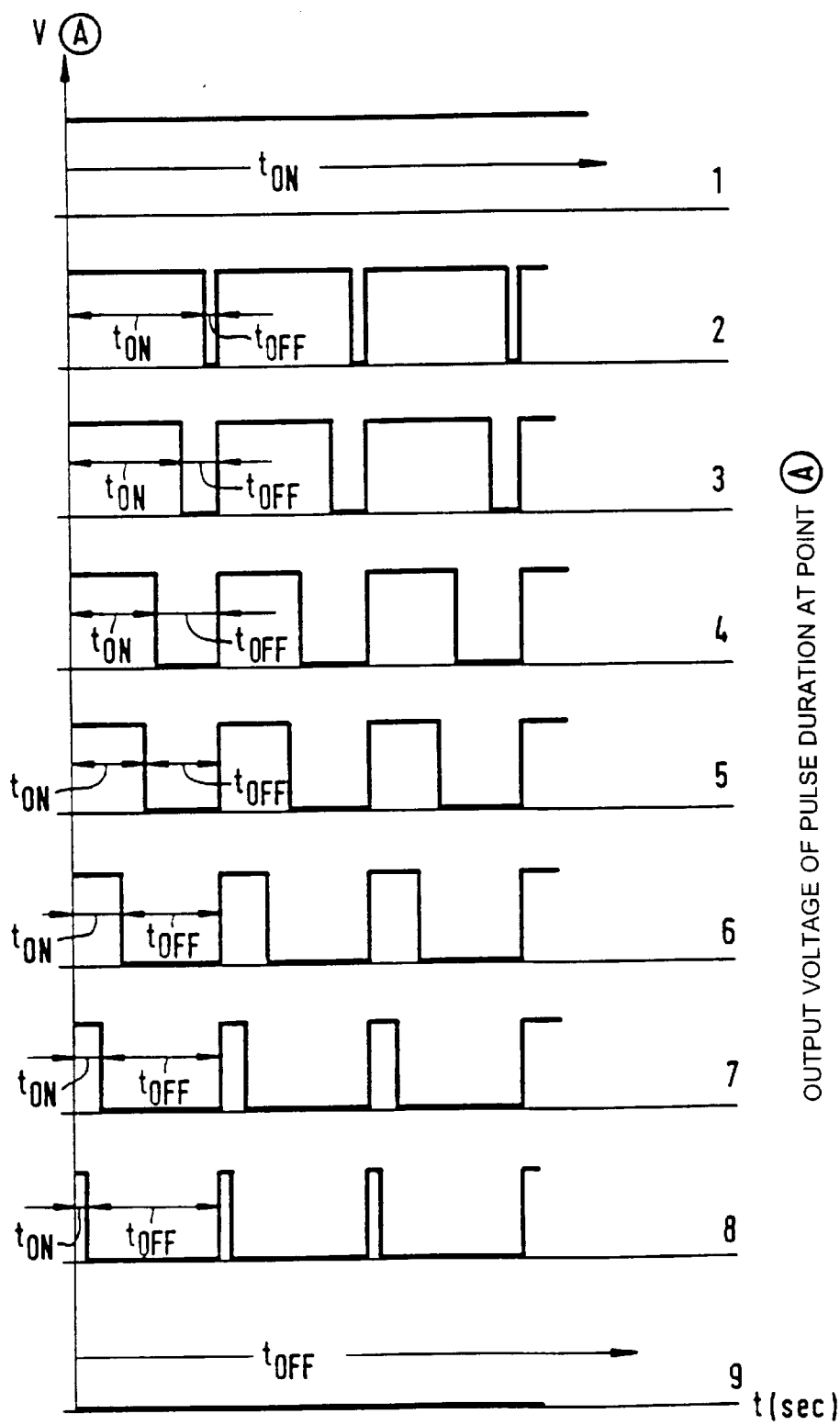
Figure 4:
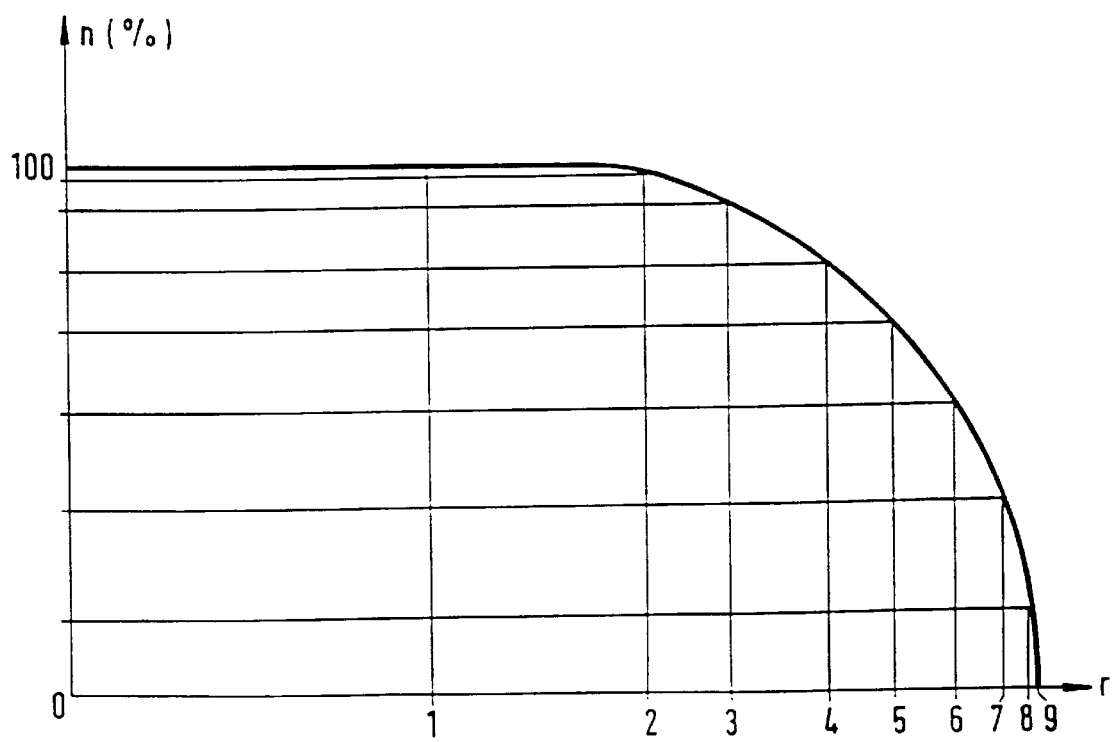

Pulse-duration modulator 4 then reduces the pulse duty factor of the control voltage supplied to the driver circuit 3, such as in the manner shown in FIG. 3. The individual pulse duty factors of FIG. 3 are assigned numerals from 1 (full control voltage) through 9 (zero control voltage). FIG. 4 illustrates the rotational frequency (as a percent of the rated speed) plotted against these pulse duty factors, with the pulse duty factors 1 to 9 corresponding to those shown in FIG. 3. The curve corresponds essentially to the voltage curve of a battery with the load switched on until it is completely discharged.

In this manner, deep discharging of the battery is avoided. Because an abrupt stopping of the motor is prevented, the risk of hair being painfully snagged in a shaver or hair clipper by accident is reduced. It will be appreciated that this effect can be achieved with an analog circuit as well as with the digital circuit described above.

As will be explained more fully below with respect to FIGS. 5–7, the method of the invention helps to assure that the storage battery's charge status actually corresponds to this low-charge voltage U detected by voltage discriminator 8 before counter 5 and the second indicator of display 9 are started.

In the flow sequence of FIG. 5 it is checked whether the low-charge point of the storage battery is actually reached at the instant of time when the storage battery's terminal voltage falls below the predetermined lower threshold value. In step 501 it is checked, therefore, whether the storage battery's terminal voltage has reached or fallen below the predetermined lower threshold value. If the answer is no, the routine branches to step 505 in which the readout of the display is controlled in accordance with the cumulative operating time of the power-consuming device recorded by the counter (i.e., in accordance with the calculated "time-based" charge status).

If the terminal voltage of the storage battery has fallen below the predetermined lower threshold value, the routine proceeds to step 502 in which it is checked whether the calculated time-based charge status has reached or fallen below a predetermined lower limit. If the low-charge point of the storage battery is set at 10 or 20 percent of the rated capacity of the storage battery, for example, the value of this lower limit of the time-based charge status can correspond to a 30 to 40 percent residual capacity of the storage battery, for example.

If the check in step 502 turns out negative, it can be concluded that an abnormal operating situation is present. It is possible to trace this to certain operating situations that can be indicated likewise to the user. This is shown in more detail in FIG. 7 dealing with step 504.

At step 505 the storage battery charge status continues to be indicated on the display in accordance with the calculated time-based charge status.

If the check in step 502 turns out positive, the routine proceeds to step 503 in which the readout of the display is reset to show a charge status of the storage battery that corresponds to the storage battery terminal voltage in accordance with the lower threshold value of the storage battery terminal voltage at normal load (the "voltage-based" low charge status).

Figure 5:
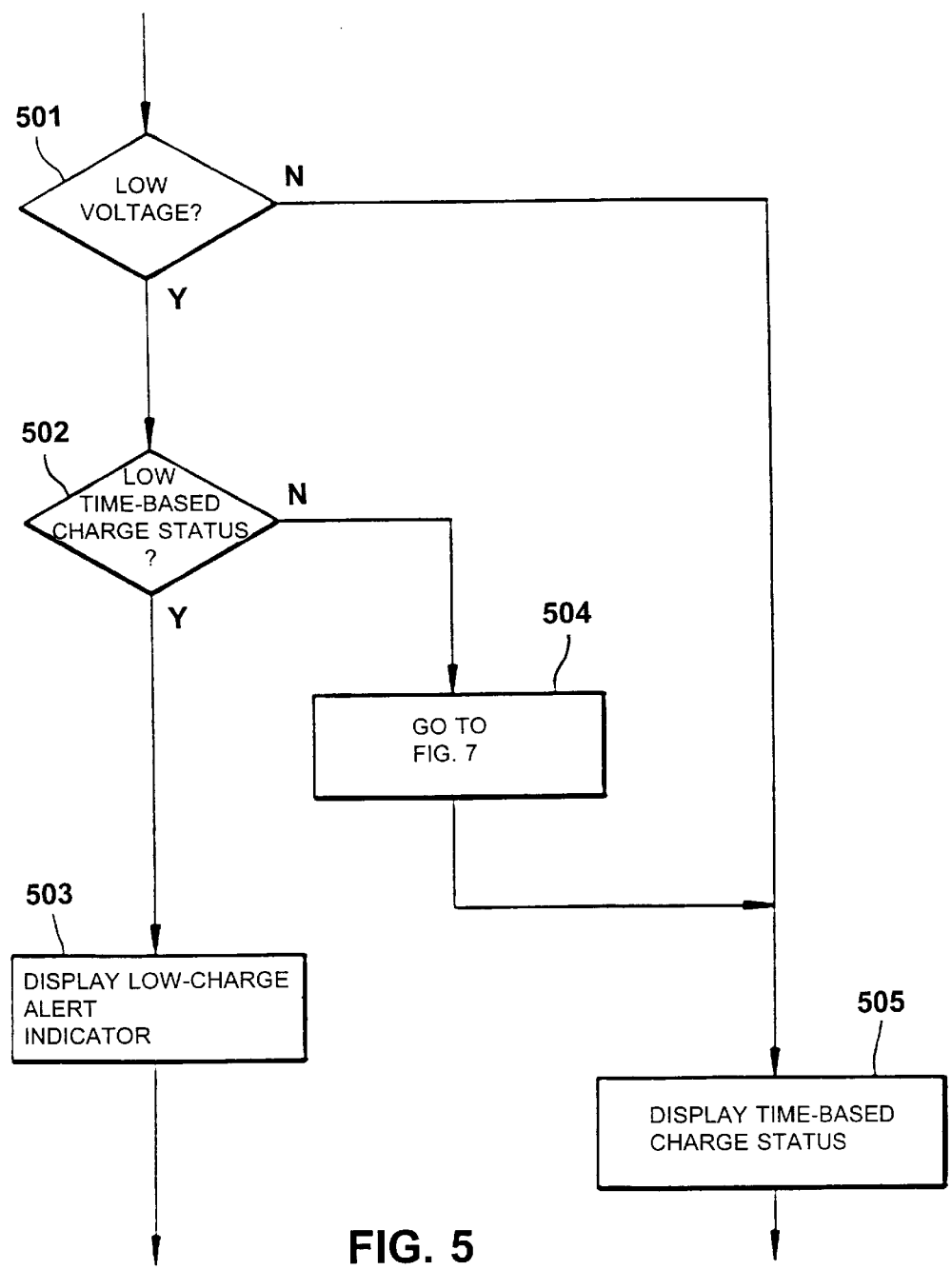
FIGS. 5–7 are flow charts illustrating improved methods of determining and displaying battery charge status, according to the invention and as employed in improved versions of the device of FIGS. 1 and 2. Of these.
Figure 6:
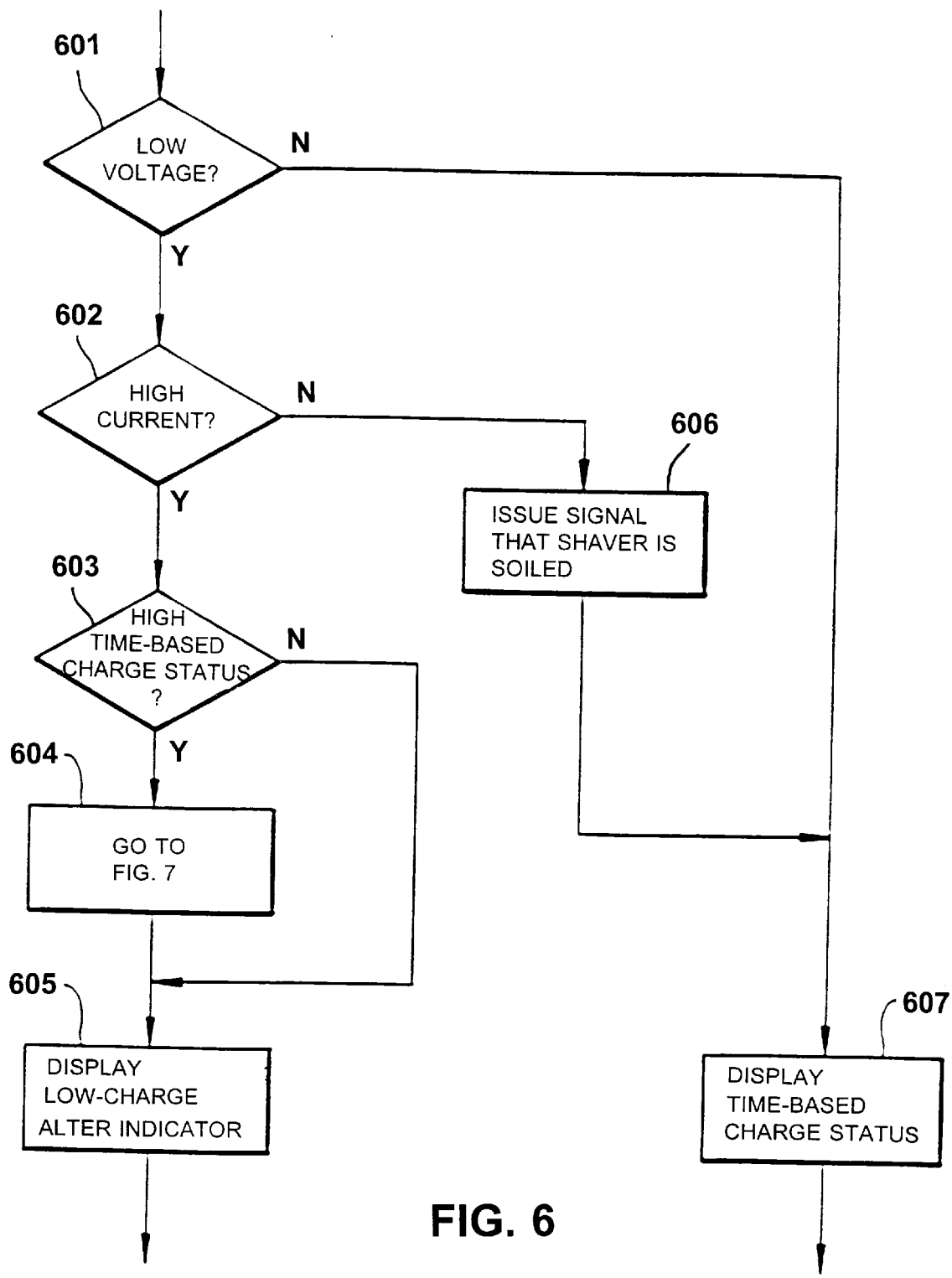

The sequence outlined in FIG. 6 is an alternative to the sequence of FIG. 5. In step 601, as in step 501 of FIG. 5, the storage battery terminal voltage is compared to its predetermined lower threshold value.

If the battery voltage is still above its lower threshold value, the routine branches to step 607 in which the readout of the display (the charge indicator) is controlled in accordance with the calculated time-based charge status.

If battery voltage is at or below the predetermined lower threshold value, the routine proceeds to step 602 in which the current flowing with the switch "ON" is compared to a predetermined current limit value corresponding to the current consumption of the power-consuming device under normal operating conditions.

If the measured current is lower than the predetermined limit value, in step 603 the time-based charge status is compared to a predetermined lower limit. If the low-charge point of the storage battery is set at 10 to 20 percent of rated capacity, for example, the value of this lower limit can correspond to 30 to 40 percent of the rated battery capacity.

If the comparison made in step 603 reveals that the time-based charge status has not yet reached its predetermined lower limit, this is interpreted as an indication that the storage battery has aged, that the characteristic curve of battery voltage as a function of time has shifted to lower voltage values with progressive discharge. The routine of FIG. 7 is then initiated in step 604. The flowing of a high load current is considered in the routine of FIG. 7 as a possible explanation for this operating condition. This explanation of FIG. 7 only applies, however, to the extent that the routine of FIG. 7 is called from the routine of FIG. 5. As called from FIG. 6, the high current possibility is already excluded by the query in step 602. Thus with the routine of FIG. 7 included in step 604, the comparison of step 701 could actually be omitted. However, in order to rule out a faulty indication regarding the aging of the storage battery due to a non-recurring deviation of the calculated charge status from the actual charge status of the storage battery, we recommend including the comparison of step 701 even when called from FIG. 6.

Subsequent to step 604 and also in the event of the answer "no" upon the comparison in step 603, the routine proceeds to step 605 in which the readout of the display is reset to indicate the voltage-based charge status corresponding to the lower threshold value of the battery voltage under normal load.

It is also conceivable, however, to omit steps 603 and 604, proceeding directly to step 605 in the event of a positive comparison in step 602.

A comparatively large load current is flowing if the check in step 602 turns out negative. With an electric shaver this may be attributable, for example, to the user having a relatively strong beard or alternatively, to a relatively advanced state of soiling of the shaver. In this case a signal can be issued in accordance with step 606 to indicate to the user that the shaver is soiled. Since this operating condition and its cause are not unequivocally repeatable, however, it is also conceivable to combine this signal with signals generated elsewhere in order to obtain more certain evidence and to subject the signal to appropriate evaluation in accordance with step 606, for example by driving a readout or by suitably adapting the motor speed.

At step 607 the time-based charge status continues to be indicated on the display.

In one preferred embodiment, fixed time counter 5, oscillator 6 and pulse duration modulator 4 are components of a single microprocessor, resulting in a simple implementation of the methods of FIGS. 5 and 6. It is then also possible to readily calculate time-based charge status by accumulating the operating time in the microprocessor. Advantageously, the display indicator is divided into several segments, corresponding to a certain percentage charge of the storage battery. The storage battery's charge can then be indicated by means of the individual segments in steps of, for example, 20% of rated charge. As the progressive discharge of the storage battery is monitored, the corresponding segments of the display are used for the indication. Provision is also made for additional display indicators which can be employed when the low-charge status is reached. In this connection it is also possible to indicate how many shaves' worth of charge remain instead of showing how many minutes of operating time are left before the shaving apparatus is switched off. For this purpose it is possible to employ the microprocessor to evaluate how much time the user needs for an average shave. On the basis of this average shaving time it is then possible to convert a residual operating time of the shaving apparatus into a remaining number of shaves.

Figure 7:
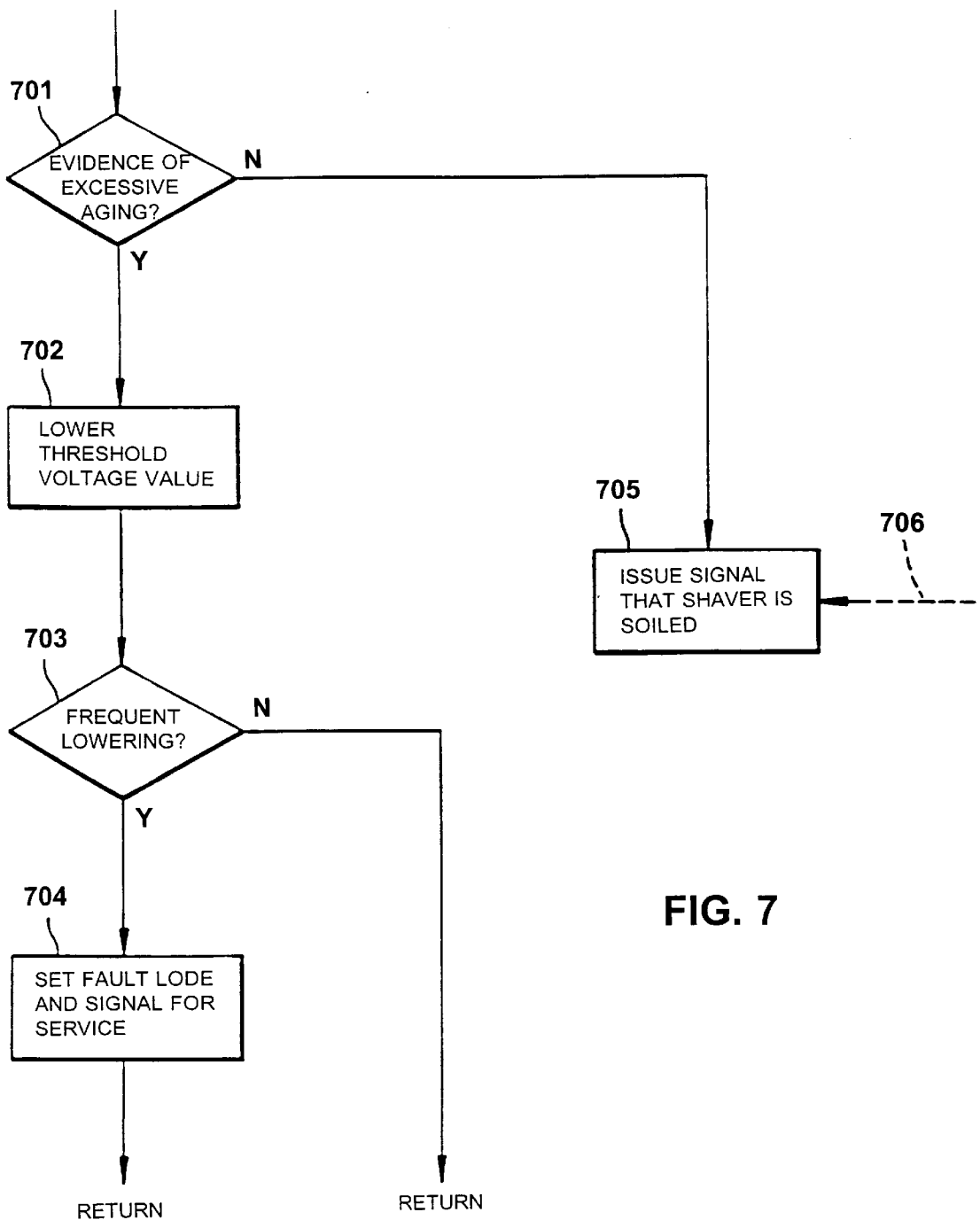

FIG. 7 shows a detailed expansion of steps 504 and 604 of FIGS. 5 and 6, respectively. The situation at this point of the routine in FIG. 5 is that battery voltage has reached or fallen below its predetermined lower threshold value, but the time-based charge status has not yet reached or fallen below its predetermined lower limit.

The flowing of a comparatively large load current is a possible reason for this situation. With an electric shaver this may be attributable to the user's relatively strong beard, for example, or also to a relatively advanced state of soiling of the shaver, as discussed above.

Another explanation is that the storage battery has aged, causing the characteristic curve of the storage battery's voltage as a function of time to shift to lower voltage values when the storage battery discharges. This means terminal voltage, which in a new storage battery reaches a predetermined lower threshold value only at an advanced state of discharge, will in an aged storage battery reach the same threshold at a higher state of residual charge.

A sign of aging of the storage battery is, for example, when the routine in FIG. 5 branches to step 504 for the first time after several years of use of the battery-powered appliance. It is also conceivable to deduce aging of the storage battery if the routine branches to step 504 several times during a single charge/discharge cycle, it being possible for this branching to occur repetitively on successive executions of the routine. It is also conceivable to combine this criterion of repeat occurrence with the criterion of first-time occurrence after the appliance has been in use for several years. If additionally a signal is present indicating a certain degree of soiling of the appliance, detected independently of the method herein described, it is conceivable to interpret a branching to step 504 as a detection of storage battery aging only when the degree of soiling of the appliance does not exceed a predetermined threshold.

It is also possible to take account of the aging of the storage battery by lowering the predetermined lower threshold value by a specified amount. This amount is preferably in the range of from 40 to 50 mV when the predetermined lower threshold value for a new storage battery is 2.38 volts. Better coordination between time-based and voltage-based charge status is thus possible for further operation. Since the battery capacity available to a connected power-consuming device decreases as the aging of the storage battery increases, the time intervals of the counter as well as the value of the fixed time counter can be correspondingly adapted to improve the time-based charge status.

If the predetermined lower threshold value was lowered at or above a preset frequency, it is taken to indicate that the aging of the storage battery is so far advanced as to necessitate battery replacement. It is possible for this preset frequency to be set so low that the storage battery is determined to need replacement after the first branch to step 504; it is also possible, however, for the present frequency to be a triple lowering, for example, of the predetermined lower threshold value. It is then possible for the aging of the storage battery to be indicated at least indirectly by driving an indicating element signaling to the user that the shaving apparatus requires servicing. During this servicing the possibility may exist to read a memory inside the shaver in which a code indicative of a defective storage battery has been entered. By virtue of this fault code it is then possible without any great effort to identify the storage battery as a source of trouble during troubleshooting and to replace it before the shaving apparatus becomes unusable. If the shaving apparatus contains appropriate devices to identify other sources of trouble, other fault codes indicative of the source of trouble can also be entered in the memory. When one of the these fault codes is entered, the indicating element which signals to the user that the appliance requires servicing is then activated likewise. Hence for the user it is only evident that the appliance needs to be serviced. During servicing the respective fault can then be found quickly by evaluation of the individual fault code, without the appliance having to undergo a complete examination.

If the check reveals that branching to step 504 is attributable to the flowing of a relatively high load current, it is possible to produce a signal indicating to the user a soiled condition of the shaver, for example. However, since this condition may have other causes, such as a particularly strong beard, it may be preferable to combine this signal with signals generated elsewhere in order to obtain more certain evidence and to subject the signal to appropriate evaluation. This evaluation can consist, for example, of a readout being driven or the motor speed being suitably adapted, signalling to the user the need for shaver maintenance (e.g., that it needs a cleaning).

Referring to FIG. 7, step 701 consists of an evaluation of whether or not there is sufficient indication that the battery has excessively aged, based on one or more criteria. The evaluation criteria can include, for instance, whether the branching to step 504 occurs for the first time after several years of using the appliance, whether the branching to step 504 occurs repeatedly during discharge and each intermediate recharge of the storage battery, and/or whether the soiling of the appliance does not exceed a predetermined threshold.

If it is determined that the battery has not excessively aged, the routine branches to step 705 in which, preferably in combination with a further signal 706, the user is notified that cleaning is necessary, or alternatively, the motor speed of the appliance is suitably adapted.

If the check in step 701 turns out positive, the predetermined lower threshold value is lowered in accordance with step 702 in order to take account of the aging of the storage battery.

In step 703 it is then checked whether a preset frequency has been reached in the lowering of the predetermined lower threshold value. This check can be made in particular by increasing a counter for this lowering in step 702 for each instance of lowering, this counter being then checked in step 703. If the count is at a preset maximum value, which in particular may lie in the range from 2 to 5, the routine process to step 704.

A fault code, which is indicative of the progressive aging of the storage battery and can be read during servicing of the appliance, is set in step 704. At the same time a readout is activated, signaling to the user the need to service the appliance.

If the check in step 703 reveals that the preset frequency has not yet been reached, the routine of FIG. 7 is ended.

We claim:

1. A method of determining and displaying charge status of a storage battery connected to a power-consuming device through which the storage battery is discharged to a predetermined residual charge, the method comprising calculating a time-based charge status corresponding to cumulative operating time of the power-consuming device, comparing terminal voltage of the storage battery to a predetermined lower voltage threshold value, and displaying a predetermined low charge alert indicator on a display only when both the time-based charge status is at or below a predetermined lower limit and the terminal voltage is below the lower voltage threshold value.

2. The method of claim 1 wherein the low charge alert indicator is displayed only when the time-based charge status is at or below a predetermined lower limit, when the terminal voltage is below the lower voltage threshold value, and when electrical current flowing from the storage battery is determined to be below a predetermined current limit.

3. The method of claim 2 wherein the predetermined current limit corresponds to an expected maximum current flow under normal operating conditions.

4. The method of claim 1 further comprising lowering the predetermined lower voltage threshold value by a specified amount when the terminal voltage falls below the lower voltage threshold value before the time-based charge status reaches its predetermined lower limit.

5. The method of claim 4 further comprising comparing the frequency at which the lower voltage threshold value is lowered to a predetermined frequency, and, when the frequency at which the lower voltage threshold value is lowered exceeds the predetermined frequency, displaying a message signaling that the power-consuming device requires service.

6. The method of claim 4 further comprising comparing the frequency at which the lower voltage threshold value is lowered to a predetermined frequency, and, when the frequency at which the lower voltage threshold value is lowered exceeds the predetermined frequency, setting, in the Dower-consuming device, a fault code readable during servicing.

7. The method of claim 1 further comprising, once the low charge alert indicator is displayed, waiting a preset length of time, and then displaying a "zero" charge status and disconnecting the power-consuming device from the storage battery unit by means of a controllable switching device.

8. The method of claim 7, wherein the power-consuming device is switched off by decreasing power consumption of the power-consuming device to zero over an extended period of time.

9. The method of claim 8, wherein the decrease in power consumption of the power-consuming device generally follows near-discharge voltage discharge characteristics of the storage battery.

10. The method of claim 7 further comprising, once the low charge alert indicator is displayed, indicating on the display a time remaining until the preset length of time has elapsed.

11. A method of determining and displaying charge status of a storage battery connected to a power-consuming device through which the storage battery is discharged, the method comprising calculating a time-based charge status based at least in part on cumulative operating time of the power-consuming device since a latest recharge;

comparing terminal voltage of the storage battery to a predetermined lower voltage threshold value;

displaying via a charge status indicator the calculated time-based charge status until the time-based charge status is at or below a predetermined lower limit and the terminal voltage is below the predetermined lower voltage threshold value; and, only when both the time-based charge status is at or below the predetermined lower limit and the terminal voltage is below the predetermined lower voltage threshold value, displaying a low-charge status indicator.

12. The method of claim 11 wherein the low-charge status indicator is displayed only when the time-based charge status is at or below the predetermined lower limit, when the terminal voltage is below the predetermined lower voltage threshold value, and when electrical current flowing from the storage battery is determined to be below a predetermined current limit.

13. A method of determining and displaying charge status of a storage battery connected to a power-consuming device through which the storage battery is discharged, the method comprising monitoring cumulative operating time of the power-consuming device since a latest recharge;

monitoring terminal voltage of the storage battery; and, only when cumulative operating time is above a predetermined upper limit and terminal voltage is below a predetermined lower limit, displaying a low-charge status indicator.

14. The method of claim 13 wherein the low-charge status indicator is displayed only when the cumulative operating time is above the predetermined upper limit, when the terminal voltage is below the predetermined lower limit, and when electrical current flowing from the storage battery is determined to be below a predetermined current limit.

\* \* \* \* \*